United States Patent
Mizuta et al.

(10) Patent No.: US 6,483,135 B1
(45) Date of Patent: Nov. 19, 2002

(54) FIELD EFFECT TRANSISTOR

(75) Inventors: Masashi Mizuta, Tokyo (JP); Masaaki Kuzuhara, Tokyo (JP); Yasunobu Nashimoto, Tokyo (JP); Kazunori Asano, Tokyo (JP); Yosuke Miyoshi, Tokyo (JP); Yasunori Mochizuki, Tokyo (JP)

(73) Assignee: NEC Compound Semiconductor Devices, Ltd., Kawasaki (JP)

( * ) Notice: Subject to any disclaimer, the term of this patent is extended or adjusted under 35 U.S.C. 154(b) by 0 days.

(21) Appl. No.: 09/383,983

(22) Filed: Aug. 26, 1999

(30) Foreign Application Priority Data

Sep. 22, 1998 (JP) ............................. 10-268394

(51) Int. Cl.$^7$ .............................................. H01L 29/80
(52) U.S. Cl. ...................... 257/283; 257/496; 257/356; 257/409; 438/574; 438/579
(58) Field of Search ................................ 257/283, 496, 257/356, 493, 409; 438/570, 574, 579

(56) References Cited

U.S. PATENT DOCUMENTS

| | | | | |
|---|---|---|---|---|
| 3,636,417 A | * | 1/1972 | Kimura ........................ 317/234 |
| 4,223,327 A | * | 9/1980 | Nara et al. ..................... 357/15 |
| 4,532,532 A | * | 7/1985 | Jackson ........................ 357/15 |
| 4,551,905 A | * | 11/1985 | Chao et al. .................... 29/571 |
| 4,742,377 A | * | 5/1988 | Einthoven ..................... 357/15 |
| 5,281,839 A | * | 1/1994 | Cambou et al. ............. 257/345 |
| 5,374,835 A | * | 12/1994 | Shimada et al. ............. 257/284 |
| 5,384,273 A | * | 1/1995 | Davies et al. .................. 437/41 |
| 5,399,886 A | * | 3/1995 | Hasegawa .................... 257/192 |
| 5,449,932 A | * | 9/1995 | Fujii ............................. 257/284 |
| 5,548,150 A | * | 8/1996 | Omura et al. ................ 257/349 |
| 5,777,366 A | * | 7/1998 | Contiero et al. ............. 257/355 |
| 5,872,369 A | * | 2/1999 | Inokuchi ...................... 257/66 |
| 6,037,615 A | * | 3/2000 | Maysuyama et al. ........ 257/192 |

FOREIGN PATENT DOCUMENTS

| | | | | |
|---|---|---|---|---|
| JP | 54-109465 | | 1/1953 | |
| JP | 357193070 | * | 11/1982 | ................... 55/304 |
| JP | 361089674 | * | 5/1986 | ..................... 418/2 |
| JP | 363087773 | * | 4/1988 | ................... 15/238 |
| JP | 1-96966 | | 4/1989 | |
| JP | 406037304 | * | 2/1994 | |
| JP | 7-37905 | | 2/1995 | |
| JP | 7-74184 | | 3/1995 | |
| JP | 407074184 | * | 3/1995 | |

OTHER PUBLICATIONS

Japanese Office Action dated Aug. 22, 2000, with partial English Translation.

* cited by examiner

*Primary Examiner*—Eddie Lee
*Assistant Examiner*—Eugene Lee
(74) *Attorney, Agent, or Firm*—McGinn & Gibb, PLLC

(57) ABSTRACT

A field effect transistor includes a semiconductor substrate with a channel layer being formed on its surface, a source electrode and a drain electrode formed at a distance on said semiconductor substrate, and a gate electrode placed between the source electrode and the drain electrode and making a Schottky junction with the channel layer. The gate electrode is provided with an overhanging field plate section and between the field plate section and the channel layer, there is laid a dielectric film. When the relative permittivity and the film thickness of the dielectric film are denoted by $\in$ and t (nm), respectively, the following condition is satisfied $5 \leq \in < 8$, and $100 < t < 350$.

21 Claims, 16 Drawing Sheets

(a)

(b)

(c)

(d)

(e)

(f)

(g)

(a)

(b)

(c)

(d)

(a)

(b)

(c)

(d)

(e)

(a)

(b)

(c)

(d)

(e)

(f)

Top view of the field control electrode 9

(a)

(b)

(a)

(b)

(c)

(d)

(e)

(f)

(g)

FIELD EFFECT TRANSISTOR

BACKGROUND OF THE INVENTION

1. Field of the Invention

The present invention relates to a Schottky gate field effect transistor (FET) that operates in the microwave region used for mobile communication, satellite communication, satellite broadcasting and the like.

2. Description of the Prior Art

In comparison with Si, compound semiconductors are known to have high electron mobilities. For example, the electron velocity of GaAs is approximately 6 times in the low electric field and 2 to 3 times in the high electric field as fast as that of Si. Such characteristics of high-speed electrons have been put to a good use in developing applications thereof to high-speed digital circuit elements or high-frequency analog circuit elements.

In a FET using a compound semiconductor, however, a gate electrode makes a Schottky junction with a channel layer of a substrate so that the electric field centers on a lower end (a circled field-centered section in FIG. 14) of the gate electrode on the drain side, which may cause breakdown. This is the matter of great concern, especially for a high-output FET that necessitates large signal operations.

Accordingly, several attempts have been hitherto made to prevent this field centralization on the edge section of the gate electrode on the drain side and improve characteristics to withstand voltage.

Among them, there is one attempt in which an overhanging section (referred to as a 'field plate section', hereinafter) is set in a gate electrode, and, under this, a dielectric film made of $SiO_2$ is formed. FIG. 12 shows schematically the structure of the FET disclosed in Japanese Patent Application Laid-open No. 87773/1988, wherein a dielectric film 34 is buried in a section below a gate electrode 33 on the drain side. Such a dielectric film, if set, is generally considered to be able to suppress the field centralization on the edge section of the gate electrode 33 on the drain side.

In the above-mentioned conventional techniques, however, the dielectric film must be made thin for the purpose of obtaining a sufficient effect on the field relaxation so that the value of electrostatic capacitance of a capacitor that consists of a field plate section and a channel layer separated by the dielectric film becomes large. On the other hand, the reduction in the thickness of the dielectric film tends to lead to a problem that the breakdown of the dielectric film or the leakage of the current may take place.

Further, because there is a certain limit in making the dielectric film thin, the maximum value for the electrostatic capacitance naturally exists. Therefore, to attain a sufficient effect on the field relaxation, the length of the field plate section should be more than a certain length, for example, a gate length, which may cause a problem of lowering the gain characteristics. Moreover, in this instance, high-frequency characteristics worsen significantly and this may become a crucial problem, depending on the purpose of use thereof.

SUMMARY OF THE INVENTION

Accordingly, an object of the present invention is to overcome the above-mentioned problems associated with the prior art and provide a FET having high withstand voltage characteristics and good gain characteristics, together with excellent high-frequency characteristics.

In light of the above problems, the present invention provides a FET, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer; wherein:

said gate electrode is provided with an overhanging field plate section; and between said field plate section and said channel layer, there is laid a dielectric film made of a high dielectric material with a relative permittivity of 8 or more.

In the FET of the present invention, because a dielectric film is laid between the field plate section and the channel layer, the field centralization which develops on the edge section of the gate electrode on the drain side is made to relax and spread over, improving characteristics of withstand voltage. This results from a fact that a capacitor that consists of the field plate section and the- channel layer separated by the dielectric film has a function to end the electric flux line starting from ionized donors.

In the FET of the present invention, as a material for the dielectric film laid between the field plate section and the channel layer, a material with a relative permittivity of 8 or more is utilized. Therefore, even when the dielectric film is made thick, a high electrostatic capacitance can be obtained and, in consequence, a sufficient effect on the field relaxation can be attained. For example, compared with a $SiO_2$ film being used in the prior art, the film thickness can be made about twice as much as the conventional thickness to obtain the same given electrostatic capacitance.

As described above, since the film thickness of the dielectric film in the present invention can be made greater than the conventional one, the breakdown of the dielectric film and the generation of the leakage current can be prevented and characteristics of withstand voltage of element can be improved.

Further, because the dielectric film with a high permittivity is laid therein, as mentioned above, even if the length of the field plate section is not very long, a sufficient effect on the field relaxation can be attained. For instance, the length of the field plate section can be shorter than the gate length. Therefore, high withstand voltage characteristics can be obtained, while the reduction of the gain characteristics is kept down.

Further, the present invention provides a FET comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer; wherein:

said gate electrode is provided with an overhanging field plate section; and between said field plate section and said channel layer, there is laid a dielectric film; and when the relative permittivity and the film thickness of the dielectric film are denoted by $\in$ and t (nm), respectively, one of the following conditions (1) and (2) is satisfied.

$$1 < \in < 5, \text{ and } 25 < t/\in < 70, \quad (1)$$

$$5 = \in < 8, \text{ and } 100 < t < 350. \quad (2)$$

In the prior art, it was difficult to achieve a sufficient effect on the field relaxation, while preventing the breakdown of the dielectric film directly under the field plate section and the leakage of the current at the same time.

The present invention attempts to overcome this, by looking into the relative permittivity and the film thickness of the dielectric film and defining the relation between there two.

When $1<\in<5$ is satisfied, if $t/\in$ is less than 25, the breakdown of the dielectric film or the leakage current takes place. On the other hand, if $t/\in$ exceeds 70, a sufficient effect on the field relaxation cannot be attained. The relative permittivity and the film thickness mean the average values of the relative permittivity and the film thickness of the dielectric film directly under the field plate section, respectively. In the case that a plurality of dielectric films made of different materials are laid directly under the field plate section, a reduced value $(t/\in)_{RED}$ given by the following equation is used as the value of $t/\in$ thereof, $$(t/\in)_{RED} = t_1/\in_1 + t_2/\in_2 + \ldots + t_n/\in_n$$

(n is an integer that is equal to or more than 2). dielectric films made of different materials are laid directly under the field plate section, a reduced value $(t/\in)_{RED}$ given by the following equation is used as the value of $t/\in$ thereof, $$(t/\in)_{RED} = t_1/\in_1 + t_2/\in_2 + \ldots + t_n/\in_n$$

(n is an integer that is equal to or more than 2).

Further, when $5 \leq \in < 8$ is satisfied, if t is less than 100, the breakdown of the dielectric film or the leakage current takes place. On the other hand, if it exceeds 350, a sufficient effect on the field relaxation cannot be attained. The film thickness means the average value of the film thickness of the dielectric film directly under the field plate section.

As described above, in the FET of the present invention, a dielectric film with a relative permittivity of 8 or more is formed between a field plate section of a gate electrode and a channel layer. The use of such a material with a high permittivity allows making the film thickness of the dielectric film substantial, while maintaining a sufficient effect on the field relaxation. In consequence, the FET of the present invention is well protected against the breakdown of the dielectric film and the generation of the current leakage that are the very problem for the prior art. Therefore, characteristics of withstand voltage can be improved with effect while the reduction of the gain characteristics is kept down.

Further, in the FET of the present invention, because a material having a certain relationship between the relative permittivity and the film thickness of the dielectric film is utilized as the material of the dielectric film, characteristics of withstand voltage can be improved with effect while the reduction of the gain characteristics is kept down.

Further, with a structure in which the electrostatic capacitance per unit area of a capacitor that consists of the field plate section and a channel layer separated by the dielectric film decreases with increasing distance from the gate electrode, the effect on the field relaxation due to the field plate section is moderated on the drain side, which facilitates to achieve an ideal field profile. Therefore, characteristics of withstand voltage can be improved with effect, while deterioration of high-frequency characteristics is kept down to the minimum.

Further, setting a field control electrode between the gate electrode and the drain electrode brings about the multiplication effect, together with the effect on the field relaxation due to the field plate section and further improves characteristics of withstand voltage.

Further, the formation of a sub electrode between the gate electrode and the source electrode can lead to achieve a higher efficiency of the element.

DETAILED DESCRIPTION OF THE PREFERRED EMBODIMENTS

Figure 1:
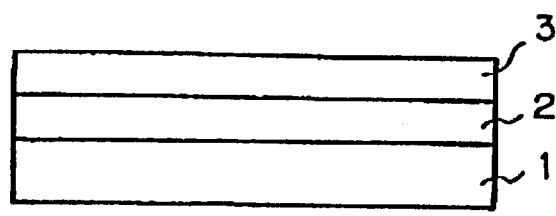
FIG. 1 is schematic cross-sectional views illustrating in sequence the steps of a manufacturing method a FET in accordance with the present invention.
Figure 1:
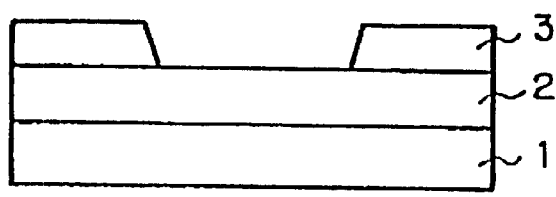
Figure 1:
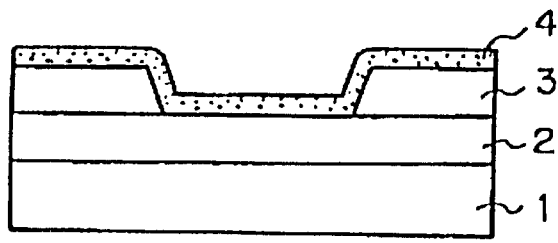
Figure 1:
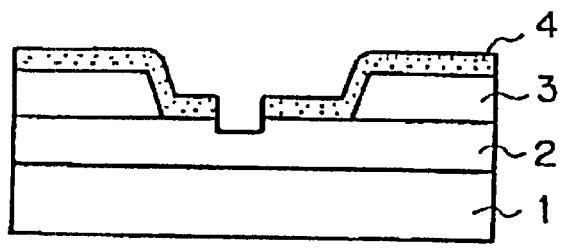

In the present invention, the high dielectric material is preferably a material selected from the group consisting aluminium oxide ($Al_2O_3$), aluminium nitride, tantalum oxide ($Ta_2O_5$), strontium titanate ($SrTiO_3$), barium titanate ($BaTiO_3$), barium titanate strontium ($Ba_xSr_{1-x}TiO_3$ (0<x<1)) and bismuth tantalate strontium ($SrBi_2Ta_2O_9$). The above materials are each well suited to be formed as a film and besides, having a high relative permittivity of 8 or more, capable to provide a high electrostatic capacitance when laid in a region below a gate electrode.

In the present invention, the dielectric film is preferably formed only in a region directly under the field plate section. For instance, as shown in FIG. 3(d), it is preferable that a dielectric film is set directly under a gate electrode 5 but not in the other region between a source electrode 7 and a drain electrode 8. In this manner, an unnecessary increase in capacitance between the gate and the drain can be avoided and a decrease in the gain, prevented.

In the case that the dielectric film is formed only in a region directly under the field plate section as mentioned above, it is preferable to make the structure of the FET in such a way that the surface of a channel layer is partially or entirely covered with a silicon oxide film and the dielectric film is laid between this silicon oxide film and the field plate section. In such a structure, over the silicon oxide film, the channel layer comes into contact with the overlying semiconductor layers and this facilitates to prevent the impairment of the device characteristics which is caused by the deterioration of the interface characteristics.

The width of a field plate section in the present invention is preferably 0.1 µm or more and still more preferably 0.1 to 2 µm. If the width of the field plate section is excessively small, characteristics of withstand voltage obtained may not be sufficient. On the other hand, when the value of the width of the field plate section is too large, both the gain characteristics and the high-frequency characteristics may worsen.

In the present invention, in using a high dielectric material for the dielectric film, the average value of the thickness of the dielectric film is preferably 100–1500 nm, and more preferably 300–1000 nm. If the dielectric film is too thick, the effect on the field relaxation is reduced. On the other hand, the excessive thinness of the dielectric film may result in the breakdown of the dielectric film or the leakage of the current. It is preferable that an appropriate value in the above range is selected, according to the value of permittivity of the dielectric film. Further, if the dielectric film comprises layers of structure, the sum of the thicknesses of all layers is preferably within the above range.

In the FET of the present invention, the electrostatic capacitance per unit area of a capacitor that consists of the field plate section and the channel layer separated by the dielectric film is preferably larger on the side of the gate electrode than on the side of the drain electrode. This moderates the effect on the field relaxation by the field plate section on the drain side and facilitates to achieve an ideal field profile. Such an arrangement, in particular, can control deterioration of high-frequency characteristics with effect.

Now, the magnitude of the above-mentioned electrostatic capacitance C is given by Equation (1).

$$C = \in S/d \tag{1}$$

(C: the capacitance, $\in$: the permittivity, S: the area of electrode, d: the distance between electrodes) Therefore, as the structure of the FET as described above, there can be considered structures in which one of the variables among the distance between electrodes d, the area of the electrode S and the permittivity $\in$ is varied with distance from the gate electrode. The following is FETs realized in this way.

(i) A Field Effect Transistor wherein the Thickness of a Dielectric Film Directly Under a Field Control Electrode is Less on the Side of a Gate Electrode than on the Side of a Drain Electrode In this structure, the change in the electrostatic capacitance per unit area is achieved by varying the distance between electrodes d.

(ii) A Field Effect Transistor wherein One or More Openings are Formed in a Field Plate Section In this structure, the change in the electrostatic capacitance per unit area is achieved by varying the area of electrode S. An example of a field plate section in such a structure is shown in FIG. 10(c). As shown in the drawing, the opening is preferably set in a part of the field plate section on the side of a drain electrode. 'An opening' in this structure is a hole made through the field plate section and may have any shape.

(iii) A Field Effect Transistor wherein the Edge Section of a Field Plate Section on the Side of a Drain Electrode is Comb-shaped In this structure, the change in the electrostatic capacitance per unit area is achieved by varying the area of electrode S. The form referred to as 'comb-shaped' herein is an intricate form the edge section of the field plate section takes, for instance, in FIGS. 10(a) and (b) The examples shown in the drawings, however, are given to illustrate the invention and not to limit the scope of the invention and any intricate form the edge section takes may be used as long as the effective area of the electrode is reduced on the side of the drain electrode.

(iv) A Field Effect Transistor wherein the Permittivity of a Dielectric Film Directly Under a Field Plate Section Decreases with Distance from a Gate Electrode In this structure, the change in the electrostatic capacitance per unit area is achieved by varying the permittivity $\in$.

In the FET of the present invention, a float electrode may be set under the field plate section. In this arrangement, electrons are kept in the float electrode even when the applied voltage to the field plate section is switched off and, in consequence, the field centralization on the edge section of the gate electrode on the drain side is relaxed and spread over. As a material for the float electrode, tungsten silicide (WSi), aluminium, gold, titanium/platinum/gold or the like can be utilized. The float electrode itself can be formed, for instance, by a method in which a metal film is applied to the entire surface by means of vapour deposition and thereafter superfluous sections are removed by ion milling with a photoresist serving as a mask.

In the FET of the present invention, a field control electrode may be additionally formed over the dielectric film on said channel layer, between said gate electrode and said drain electrode. The field control electrode has a function to end the electric flux line starting from ionized donors, and, therefore, makes the field centralization which develops on the edge section of the gate electrode on the drain side relax and spread over, which improves characteristics of withstand voltage. Together with the effect on the field relaxation due to the field plate section, this brings about the multiplication effect and further improves characteristics of withstand voltage. If both a dielectric film directly under the field plate section and a field control electrode are set, an ideal field profile can be produced between the gate electrode and the drain electrode, which results in a still further improvement in the characteristics of withstand voltage while the deterioration of the gain characteristics or the high-frequency characteristics is kept down to the minimum.

With respect to the high dielectric material used for the field control electrode, it is preferably a high dielectric material with a relative permittivity of 8 or more. For instance, any material selected from the group consisting aluminium oxide ($Al_2O_3$), aluminium nitride (AlN), tantalum oxide ($Ta_2O_5$), strontium titanate ($SrTiO_3$), barium titanate ($BaTiO_3$), barium titanate strontium ($Ba_xSr_{1-x}TiO_3$ (0<x<1)) and bismuth tantalate strontium ($SrBi_2Ta_2O_9$) is preferably utilized. Further, when the relative permittivity and the film thickness of the dielectric film are denoted by $\in$ and t, respectively, a material satisfying one of the following conditions (1) and (2) may be employed.

$$1 < \epsilon < 5, \text{ and } 25 < t/\epsilon < 70, \qquad (1)$$

$$5 \leq \epsilon < 8, 100 < t < 350. \qquad (2)$$

With regard to the material for the field control electrode, tungsten silicide (WSi), aluminium, gold, titanium/platinum/gold or the like can be utilized. The field control electrode itself can be formed, for instance, by a method in which a metal film is applied to the entire surface by means of vapour deposition and thereafter superfluous sections are removed by ion milling with a photoresist serving as a mask.

The field control electrode herein is preferably connected with the gate electrode and kept at the same electric potential, though it may be set independently at a different potential from that of the gate electrode. In particular, by adjusting the voltage applied to the field control electrode appropriately, an ideal field profile can be produced and the field centralization directly under the gate electrode can be prevented from developing and, thus, characteristics of withstand voltage can be improved, while good gain characteristics and high-frequency characteristics are maintained.

Further, in the FET of the present invention, a sub electrode may be additionally set over the dielectric film on said channel layer, between said gate electrode and said source electrode. This can lower the resistance of the region directly under the sub electrode and achieve higher efficiency of the element.

With regard to the material for the sub electrode, tungsten silicide (WSi), aluminium, gold, titanium/platinum/gold or the like can be utilized. The sub electrode itself can be formed, for instance, by a method in which a metal film is applied to the entire surface by means of vapour deposition and thereafter superfluous sections are removed by ion milling with a photoresist serving as a mask. The sub electrode is connected, for example, with a drain electrode, to which a positive voltage is applied. This lowers the resistance of the region directly under the sub electrode and eases the current flow therethrough so that higher efficiency of the element can be achieved.

In the FET of the present invention, it is preferable that a distance between the gate electrode and the drain electrode is longer than a distance between the gate electrode and the source electrode. This structure is often referred to as an offset structure and can relax and spread over the field centralization on the edge section of the gate electrode on the drain side more effectively. Moreover, from manufacturing point of view, this structure has the advantage of relative easiness in forming the field plate section. Further, the FET of the present invention preferably has a recess structure, by which the field centralization on the edge section of the gate electrode on the drain side can be relaxed and spread over more effectively. A recess structure can be a multi-stage recess.

In the FET of the present invention, a group III-V compound semiconductor such as GaAs may be utilized as a material to constitute a substrate or a channel layer. The group III-V compound semiconductors include GaAs, AlGaAs, InP, GaInAsP and the like. Using a material of a group III-V compound semiconductor, the high-speed high-output field effect transistor can be produced.

EXAMPLES

First Example

In the FET of the present example, as shown in FIG. 2(g), a gate electrode 5 is provided with an overhanging field plate section 9 and between this field plate section 9 and a channel layer, a dielectric film 4 made of $Ta_2O_5$ is formed.

Figure 2:
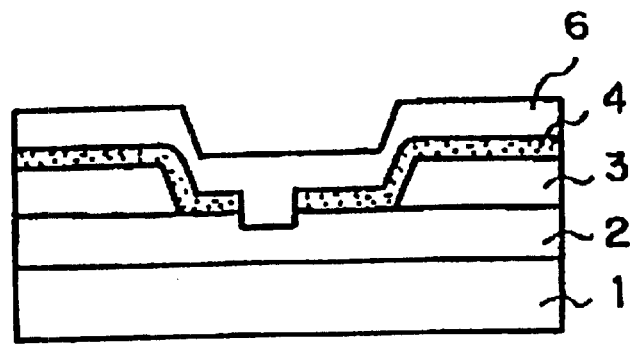
FIGS. 2(c)–2(g) are schematic cross-sectional views illustrating in sequence the further steps of the manufacturing method of the FET in accordance with the present invention.
Figure 2:
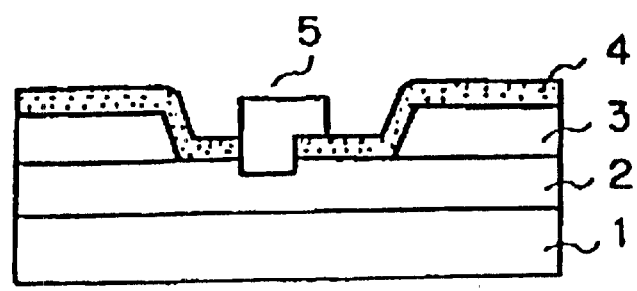
Figure 2:
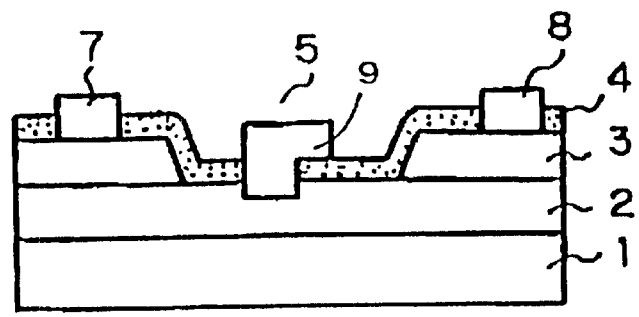

Referring to FIGS. 1 and 2, a manufacturing method of the FET of the present invention is described below.

First, upon a semi-insulating GaAs substrate 1, an N-type GaAs channel layer 2 (with a thickness of 230 nm) doped with $2 \times 10^{17}$ cm$^{-3}$ Si and an N-type GaAs contact layer 3 (with a thickness of 150 nm) doped with $5 \times 10^{17}$ cm$^{-3}$ Si are grown in succession by the MBE (Molecular Beam Epitaxy) method (FIG. 1(a)).

Next, using a resist (not shown in the drawing) as a mask, the channel layer 2 and the contact layer 3 are etched by wet etching with a sulfuric acid based or phosphoric acid based etchant so as to form a recess (FIG. 1(b)).

A dielectric film 4 of $Ta_2O_5$ is then deposited to a thickness of 300 nm over the entire surface by the CVD (Chemical Vapour Deposition) method (FIG. 1(c)). On this dielectric film 4, a resist (not shown in the drawing) is formed and, using this as a mask, a portion of the dielectric film 4 where a gate electrode is to be formed is etched by dry etching with $CHF_3$ or $SF_6$. Next, using the dielectric film 4 as a mask, a portion of the channel layer 2 where the gate electrode is to be formed is etched to a depth of 30 nm or so (FIG. 1(d)).

Next, a 100 nm-thick WSi film, a 50 nm-thick TiN film, a 15 nm-thick Pt film and a 400 nm-thick Au film are deposited, in this order, over the entire surface by sputtering, which forms a gate metal film 6 (FIG. 2(e)). After that, a photoresist is applied only to a section thereof where the gate electrode is to be formed, and the other superfluous section is removed by ion milling, and thereby a gate electrode 5 is formed (FIG. 2(f)).

Following this, the prescribed portions of the dielectric film 4 are etched to expose the contact layer 3 and then an 8 nm-thick Ni film, a 50 nm-thick AuGe film and a 250 nm-thick Au film are successively grown in this order by vacuum deposition and thereby a source electrode 7 and a drain electrode 8 are formed to accomplish a FET (FIG. 2(g)).

In the FET of the present example, because $Ta_2O_5$ (with a relative permittivity of approximately 20) is utilized as a material of the dielectric film 4 lying between the field plate section and the channel layer, it is possible to make the film thickness of the dielectric film 4 substantial while maintaining a sufficient effect on the field relaxation. Accordingly, the FET of the present example is well protected against the breakdown of the dielectric film or the generation of the current leakage, which is the very problem associated with the prior art.

Further, while $Ta_2O_5$ is employed as a material of the dielectric film 4 in the present example, any one among silicon nitride ($Si_3N_4$), aluminium oxide ($Al_2O_3$), strontium titanate ($SrTiO_3$), barium titanate ($BaTiO_3$), barium titanate strontium ($Ba_xSr_{1-x}TiO_3$ (0<x<1)) and bismuth tantalate strontium ($SrBi_2Ta_2O_9$) can be utilized. At this, the value of film thickness thereof is specifically determined according to the permittivity of the selected material. For instance, in the case that aluminium oxide ($Al_2O_3$) is used, the film thickness is set to be 150 to 300 nm.

Further, while the channel layer 2 and the contact layer 3 are formed by the MBE method in the present example, they can be formed by the MOCVD (Metal Organic Chemical Vapour Deposition) method, instead.

Second Example

Figure 3:
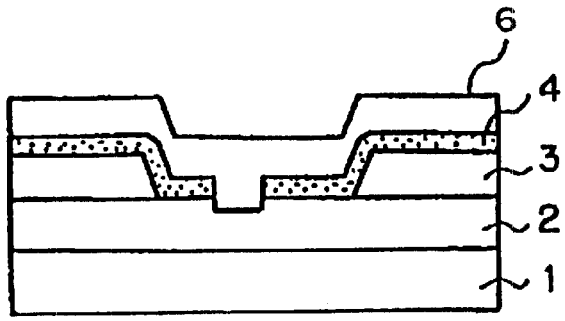
FIG. 3 is schematic cross-sectional views illustrating in sequence the steps of another manufacturing method of a FET in accordance with the present invention.
Figure 3:
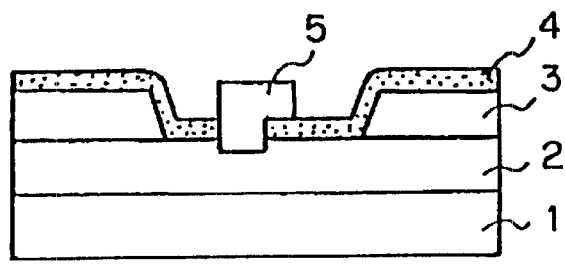
Figure 3:
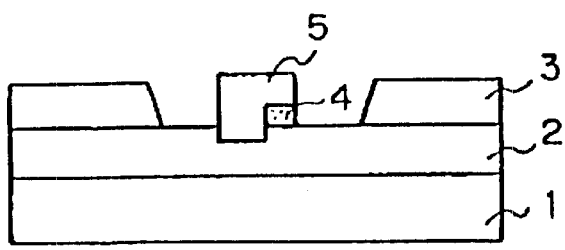
Figure 3:
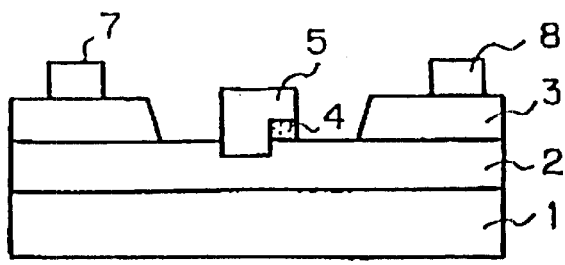

In the PET off the present example, as shown in FIG. 3(d), a dielectric film 4 or $Ta_2O_5$ is formed only in a region directly under a field plate section. Referring to FIG. 3, a manufacturing method of a FET of the present example is described below.

First, in the same way as First example, upon a semi-insulating GaAs substrate 1, a layered structure of an N-type GaAs channel layer 2, an N-type GaAs contact layer 3, a dielectric film 4 and a gate metal film 6 is formed (FIG. 3(a)). Next, a photoresist is applied only to a section thereof where a gate electrode is to be formed, and the other superfluous section is removed by ion milling, and thereby a gate electrode 5 is formed (FIG. 3(b)). Following this, the dielectric film 4 formed in the region other than the section where the gate electrode 5 is formed is removed by etching (FIG. 3(c)). After that, an 8 nm-thick Ni film, a 50 nm-thick AuGe film and a 250 nm-thick Au film are successively grown in this order by vacuum deposition and thereby a source electrode 7 and a drain electrode 8 are formed to accomplish a FET (FIG. 3(d)).

In the FET of the present example, because the dielectric film 4 made of $Ta_2O_5$ is formed only in the region directly under the field plate section, excellent gain characteristics can be obtained while maintaining withstand voltage characteristics.

Third Example

Figure 4:
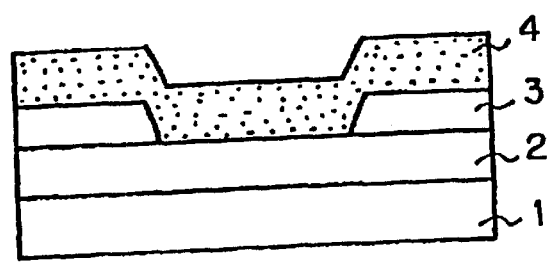
FIG. 4 is schematic cross-sectional views illustrating in sequence the steps of another manufacturing method of a FET in accordance with the present invention.
Figure 4:
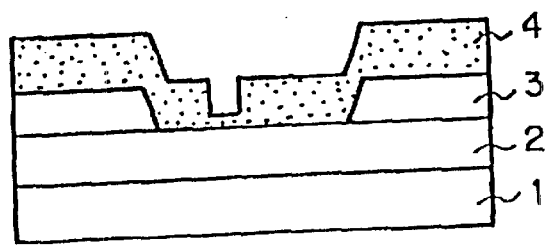
Figure 4:
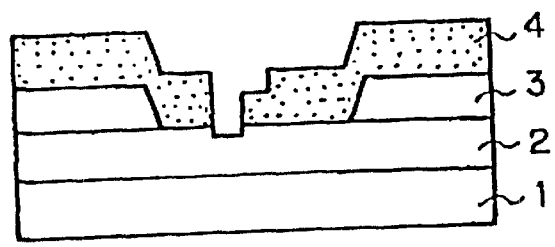
Figure 5:
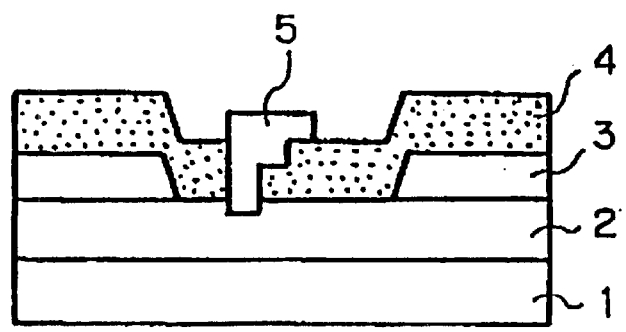
FIGS. 5(d)–5(e) are schematic cross-sectional views illustrating in sequence the further steps of the manufacturing method of the FET in accordance with the present invention.
Figure 5:
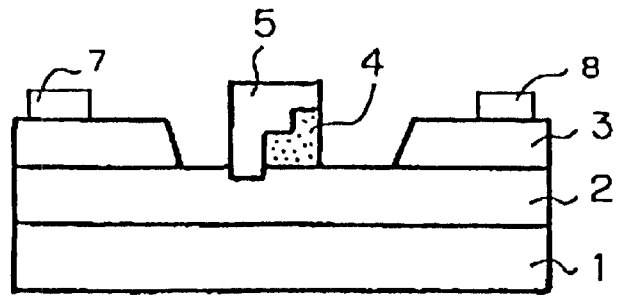

In the FET of the present example, as shown in FIG. (e), a dielectric film 4 of $Ta_2O_5$ is formed into a stepped shape in a region directly under a field plate section. Referring to FIGS. 4 and 5, a manufacturing method of a FET of the present example is described below.

First, in the same way as First example, upon a semi-insulating GaAs substrate 1, an N-type GaAs channel layer 2 and an N-type GaAs contact layer 3 are formed. Next, a dielectric film 4 of $Ta_2O_5$ is formed thereon (FIG. 4(a)). The film thickness of the dielectric film 4 is set to be 300 nm.

Following this, a photoresist (not shown in the drawing) is applied to a region other than a section where a gate electrode is to be formed and the dielectric film 4 is dry etched (FIG. 4(b)). After the photoresist is peeled off, a photoresist (not shown in the drawing) is again applied thereto but in such a way that a width of the opening section thereof is broader than the previous one and then the dielectric film 5 is dry etched (FIG. 4(c)). In this way, a stepped part in structure is shaped in the section where the gate electrode is to be formed.

Next, a 100 nm-thick WSi film, a 50 nm-thick TiN film, a 15 nm-thick Pt film and a 400 nm-thick Au film are deposited, in this order, over the entire surface by sputtering, which forms a gate metal film 6. After that, by removing the superfluous section, a gate electrode 5 is formed (FIG. 5(d)).

Next, the dielectric film 4 formed in the region other than the section where the gate electrode is formed is removed by etching. Subsequently, an 8 nm-thick Ni film, a 50 nm-thick AuGe film and a 250 nm-thick Au fim are successively grown in this order by vacuum deposition and thereby a source electrode 7 and a drain electrode 8 are formed to accomplish a FET (FIG. 5(e)). The film thickness of the dielectric film 4 for the stepped part under the field plate section is 150 nm in a thin-film section shown on the left side of the drawing and 300 nm in a thick-film section on the right side.

In the present example, because the stepped dielectric film made of $Ta_2O_5$ is formed in the region directly under the field plate section, the FET produced has excellent high-frequency characteristics, together with high withstand voltage characteristics.

Fourth Example

Figure 6:
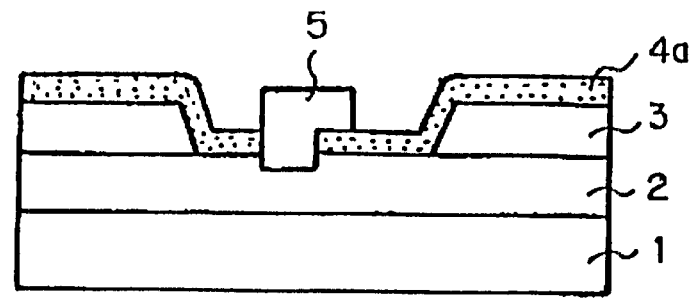
FIGS. 6(a)–6(d) are schematic cross-sectional views illustrating in sequence the steps of a manufacturing method of another FET in accordance with the present invention.
Figure 6:
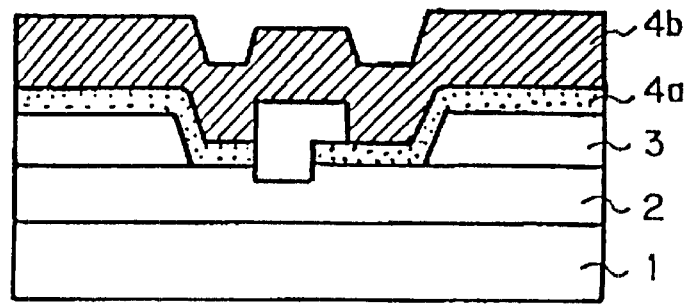
Figure 6:
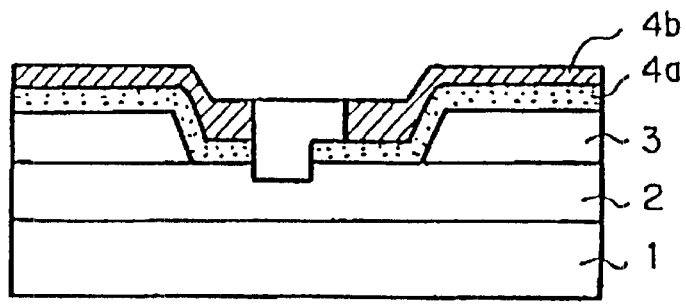
Figure 6:
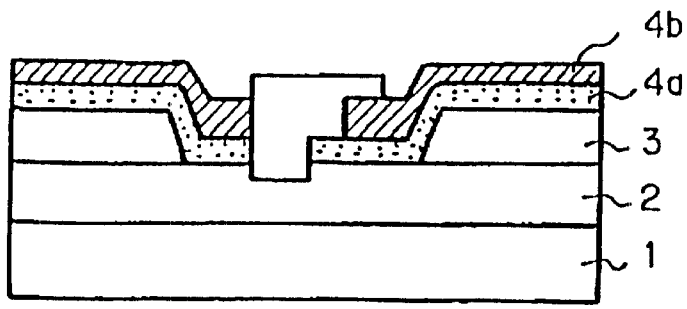
Figure 7:
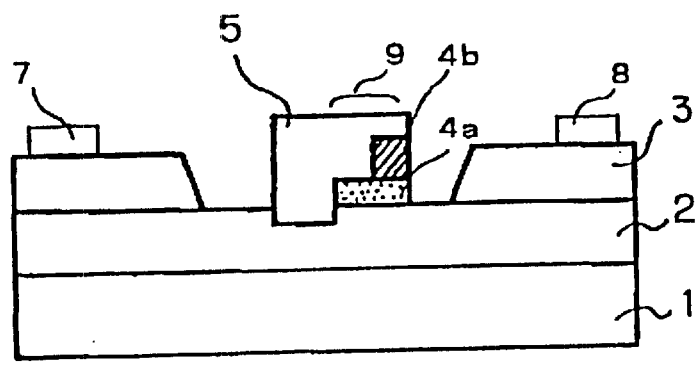
FIG. 7 is a schematic cross-sectional view showing the FET in accordance with the present invention.

As shown in FIG. 7, the FET of the present example has a structure wherein a gate electrode is provided with an overhanging field plate section and two sorts of dielectric films 4a and 4b are formed between this field plate section and a channel layer 2. The dielectric film 4b has a lower relative permittivity than the dielectric film 4a and, therefore, in the region directly under the field plate section, viewed from the gate electrode 5 towards the drain electrode 8, the relative permittivity (the average value) of the dielectric films drops when the film thickness thereof increases. Accordingly, the capacitance of a capacitor that consists of the field plate section and a channel layer 2 separated by a first dielectric film 4a and a second dielectric film 4b becomes smaller towards the drain electrode 8. Now, referring to FIGS. 6 and 7, a manufacturing method of a FET of the present example is described below.

First, in the same way as First example, upon a semi-insulating GaAs substrate 1, a layered structure of an N-type GaAs channel layer 2, an N-type GaAs contact layer 3, a first dielectric film 4a and a gate metal film 6 is formed, and the superfluous section of the gate metal film 6 is removed by ion milling, and thereby a gate electrode 5 is formed (FIG. 6(a)).

The material for the first dielectric film 4a is $Ta_2O_5$ and the film thickness thereof is 150 nm.

Next, a second dielectric film 4b is deposited over the entire surface (FIG. 6(b)). The material for the second dielectric film 4b is $Si_3N_4$ and the film thickness thereof is 150 nm.

The entire surface is then subjected to dry etching and the second dielectric film 4b lying on the gate electrode 5 is completely removed in substance (FIG. 6(c)).

Next, a 50 nm-thick TiN film, a 15 nm-thick Pt film and a 400 nm-thick Au film are deposited, in this order, over the entire surface by sputtering, which forms a gate metal film 6, again, and thereafter, by removing the superfluous section by means of ion milling, a gate electrode 5 is formed (FIG. 6(d)).

Next, the first and the second dielectric films 4a and 4b formed in the region other than the section where the gate electrode 5 is formed are removed by etching. Subsequently, an 8 nm-thick Ni film, a 50 nm-thick AuGe film and a 250 nm-thick Au film are successively grown in this order by vacuum deposition and thereby a source electrode 7 and a drain electrode 8 are formed to accomplish a FET (FIG. 7).

In the FET of the present example, because the dielectric films made of $Ta_2O_5$ and $Si_3N_4$, respectively, are formed only in the region directly under the field plate section, excellent gain characteristics can be obtained while maintaining withstand voltage characteristics.

Further, the FET of the present example has a structure in which the capacitance of the capacitor formed in the section directly under the field plate section decreases towards the drain electrode 8. This arrangement moderates the effects on the field relaxation by the field plate section on the drain side and facilitates to achieve an ideal field profile. Therefore, the FET produced has still more excellent high-frequency characteristics, together with high withstand voltage characteristics.

Fifth Example

Figure 8:
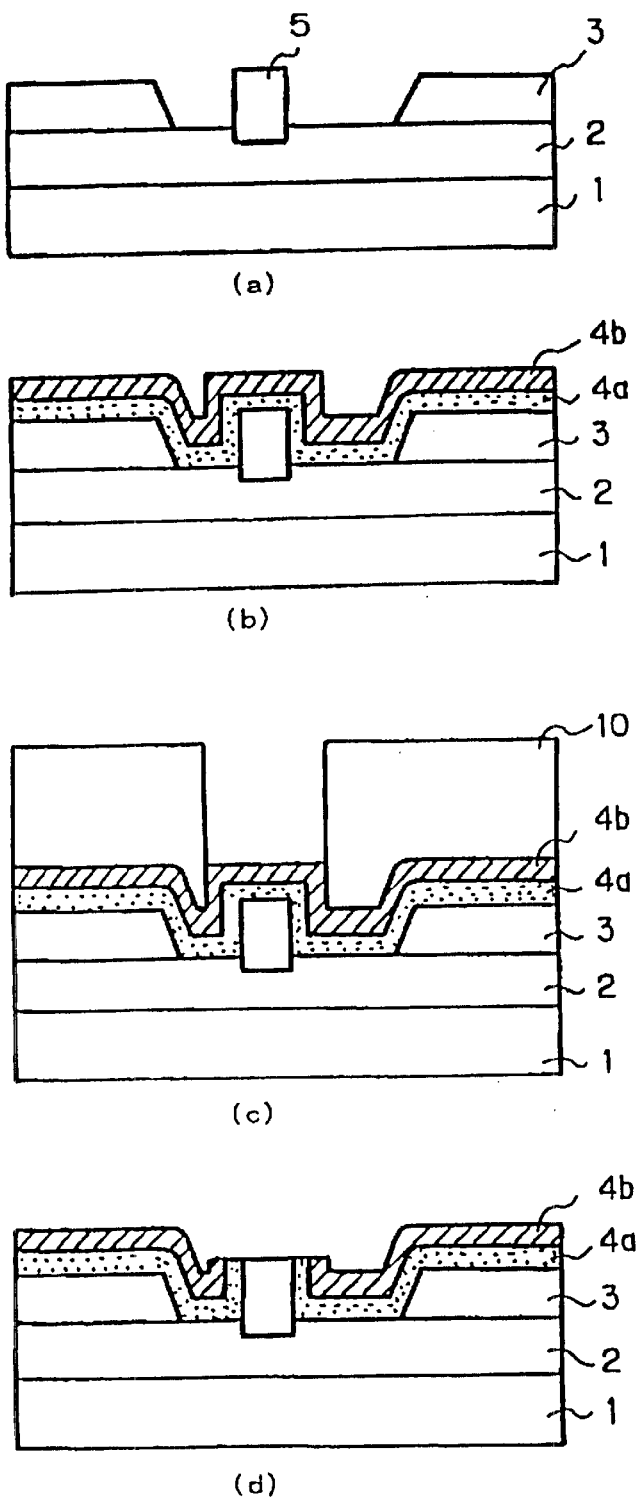
FIG. 8 is schematic cross-sectional views illustrating in sequence the steps of another manufacturing method of a FET in accordance with the present invention.
Figure 9:
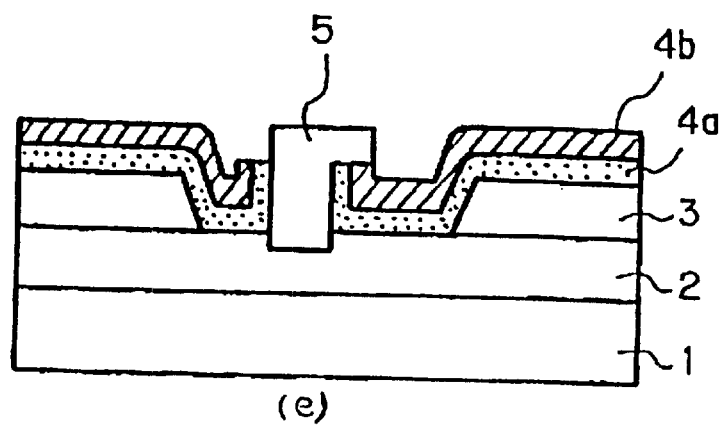
FIGS. 9(e)–9(f) are schematic cross-sectional views illustrating in sequence the further steps of the manufacturing method of the FET in accordance with the present invention.
Figure 9:
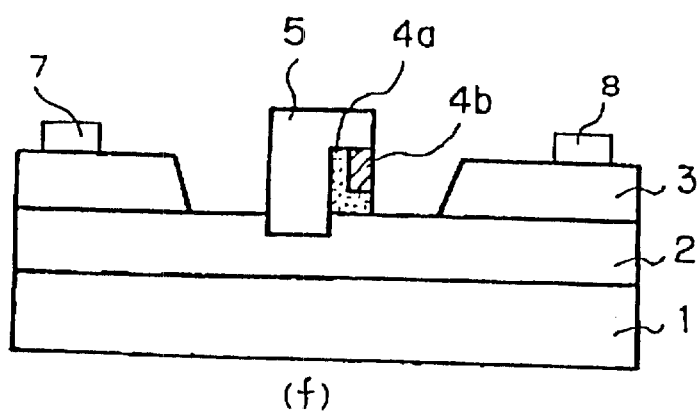

As shown in FIG. 9(f), the FET of the present example has a structure wherein two sorts of dielectric films 4a and 4b are formed between an overhanging field plate section and a channel layer 2. In the region directly under the field plate section, viewed from the gate electrode 5 towards the drain electrode 8, the relative permittivity (the average value) of the dielectric film drops. Accordingly, the capacitance of a capacitor that consists of the field plate section and the channel layer 2 becomes smaller. Now, referring to FIGS. 8 and 9, a manufacturing method of a FET of the present example is described below.

First, in the same way as First example, upon a semi-insulating GaAs substrate 1, a layered structure of an N-type GaAs channel layer 2 and an N-type GaAs contact layer 3 is formed. Next, after a gate metal film is deposited over the entire surface, the superfluous portion thereof is removed by ion milling, and thereby a gate electrode 5 is formed (FIG. 8(a)).

Next, over the entire surface, a first and a second dielectric film 4a and 4b are deposited (FIG. 8(b)). The material for the first dielectric film 4a is $Ta_2O_5$ and the film thickness thereof is 150 nm. The material for the second dielectric film 4b is $Si_3N_4$ and the film thickness thereof is 150 nm.

A photoresist is then formed, leaving only a section where a gate electrode is formed as an opening (FIG. 8(c)). Using this photoresist as a mask, dry etching is applied so as to remove completely in substance the second dielectric film 4b lying on the gate electrode 5 (FIG. 8(d)).

Next, a 50 nm-thick TiN film, a 15 nm-thick Pt film and a 400 nm-thick Au film are deposited, in this order, over the entire surface by sputtering, which forms a gate metal film 6, again, and thereafter, by removing the superfluous section by means of ion milling, a gate electrode 5 is formed (FIG. 9(e)).

Next, the first and the second dielectric films 4a and 4b formed in the region other than the section where the gate electrode 5 is formed are removed by etching. Subsequently, an 8 nm-thick Ni film, a 50 nm-thick AuGe film and a 250 nm-thick Au film are successively grown in this order by vacuum deposition and thereby a source electrode 7 and a drain electrode 8 are formed to accomplish a FET (FIG. 9(f)).

In the FET of the present example, because the dielectric films made of $Ta_2O_5$ and $Si_3N_4$, respectively, are formed only in the region directly under the field plate section, excellent gain characteristics can be obtained while maintaining withstand voltage characteristics.

Further, the FET of the present example has a structure in which the capacitance of the capacitor formed in the section directly under the field plate section decreases towards the drain electrode 8. This arrangement moderates the effects on the field relaxation by the field plate section on the drain side and facilitates to achieve an ideal field profile. Therefore, characteristics of withstand voltage can be improved, while the deterioration of the high-frequency characteristics is kept down to the minimum.

Sixth Example

Figure 10:
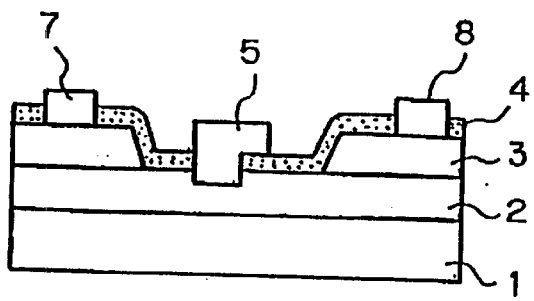
FIG. 10 is a schematic cross-sectional views (i.e, 10(a)–10(c)) showing another FET in accordance with the present invention, together with a group of schematic top plan views showing various field plate sections thereof.
Figure 10:
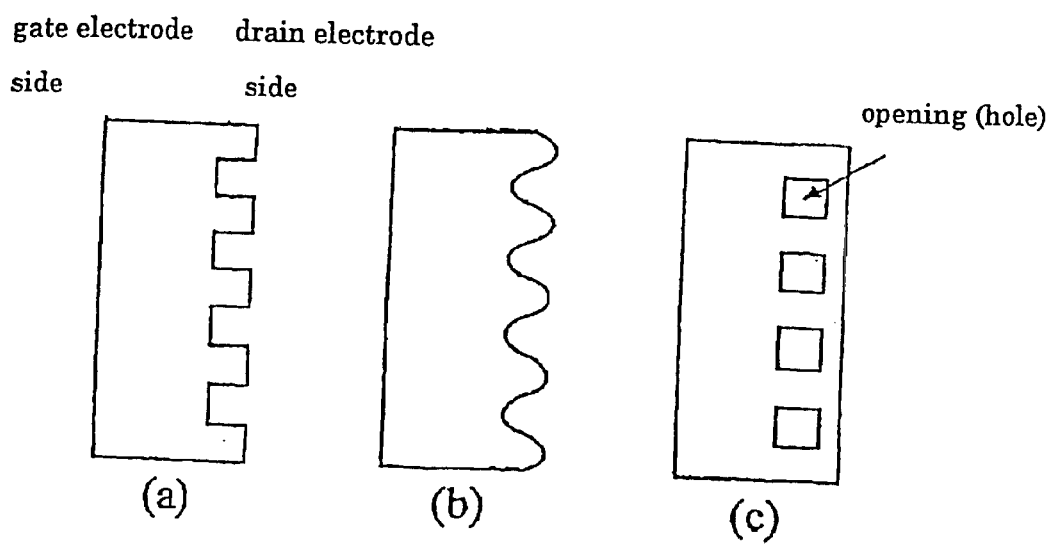

In the present example, as shown in FIG. 10, a gate electrode 5 takes a varied shape. FIGS. 10(a) and (b) each show a gate electrode 5 with the edge section on the drain side in the shape of a comb and FIG. 10(c) shows a gate electrode 5 with a plurality of openings in the edge section on the drain side. In any form, the area of electrode S in Equation (1)

$$C = \epsilon S/d \qquad (1)$$

(C: the capacitance, E: the permittivity, S: the area of electrode, d: the distance between electrodes) is reduced on the drain side and thereby the electrostatic capacitance per unit area directly under the gate electrode 5 is made smaller on the drain side than on the gate side. This arrangement moderates the effects on the field relaxation by the field plate section on the drain side and facilitates to achieve an ideal field profile. Therefore, the FET produced has still more excellent high-frequency characteristics, together with high withstand voltage characteristics.

Further, the gate electrode can be worked into a varied shape such as the one shown in FIG. 10, using known etching techniques.

Seventh Example

Figure 11:
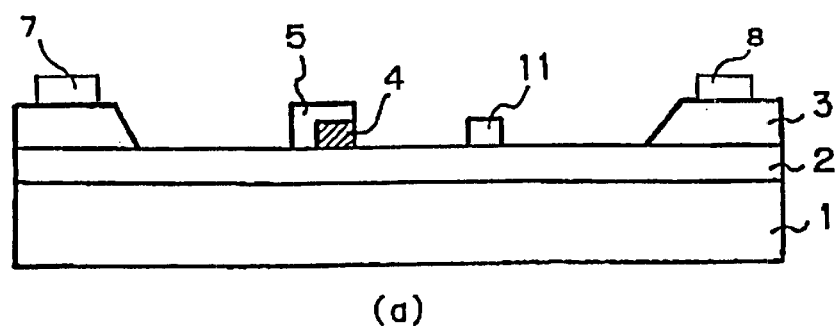
FIG. 11 is a pair of schematic cross-sectional views each showing a FET in accordance with the present invention.
Figure 11:
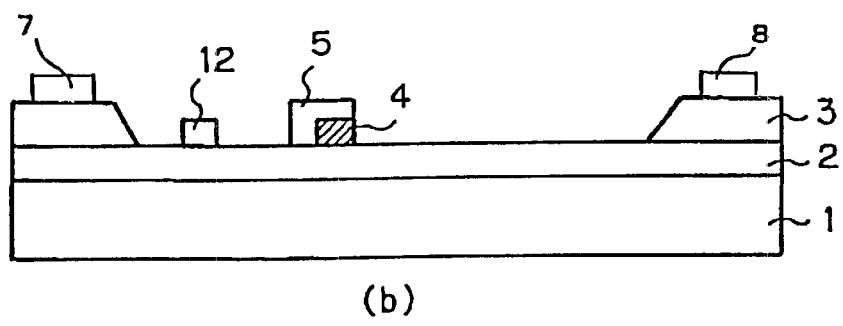
Figure 12:
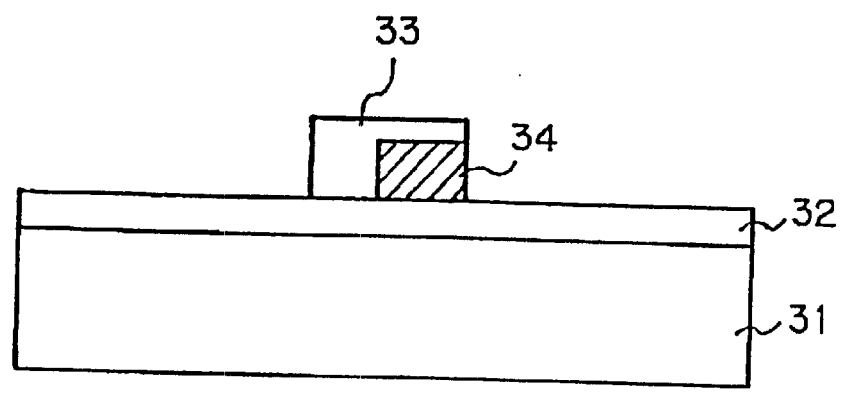
FIG. 12 is a schematic cross-sectional view showing a conventional FET.

The FET of the present example is provided with a field control electrode 11 between a drain electrode 8 and a gate electrode 5, as shown in FIG. 11(a). This arrangement further improves characteristics of withstand voltage.

This FET can be produced by forming a field control electrode 11 after a gate electrode 5 that has a dielectric film 4 directly under a field plate section is formed, following the same steps as Second example. With regard to the field control electrode 11, a 50 nm thick Ti film, a 30 nm-thick Pt film and a 200 nm-thick Au film are first grown in succession in this order over the entire surface by vacuum deposition. Thereafter the superfluous section is removed by ion milling, and thereby the field control electrode 11 is formed.

Eighth Example

The FET of the present example is provided with a sub electrode 12 between a source electrode 7 and a gate electrode 5, as shown in FIG. 11(b).

This FET can be produced by forming a sub electrode 12 after a gate electrode 5 that has a dielectric film 4 directly under a field plate section is formed, following the same steps as Second example. With regard to the sub electrode 12, a 50 nm-thick Ti film, a 30 nm-thick Pt film and a 200 nm-thick Au film are first grown in succession in this order over the entire surface by vacuum deposition. Thereafter the superfluous section is removed by ion milling, and thereby the sub electrode 12 is formed.

The sub electrode 12 is connected, for example, with a drain electrode, to which a positive voltage is applied. This lowers the resistance of the region directly under the sub electrode 12 and eases the current flow so that higher efficiency of the element can be attained.

Ninth Example

Figure 13:
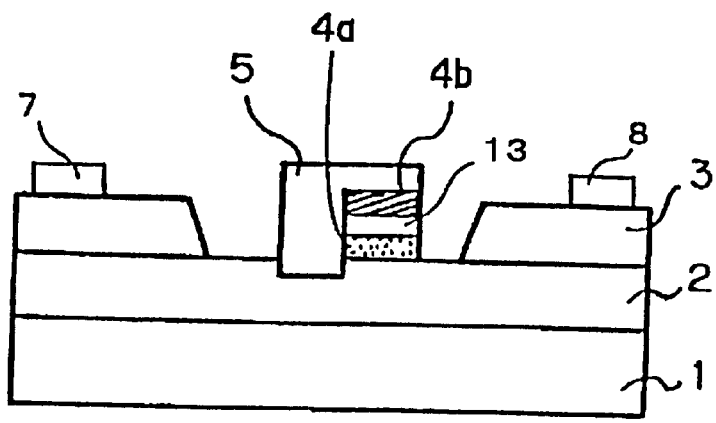
FIG. 13 is a schematic cross-sectional view showing another FET in accordance with the present invention.
Figure 14:
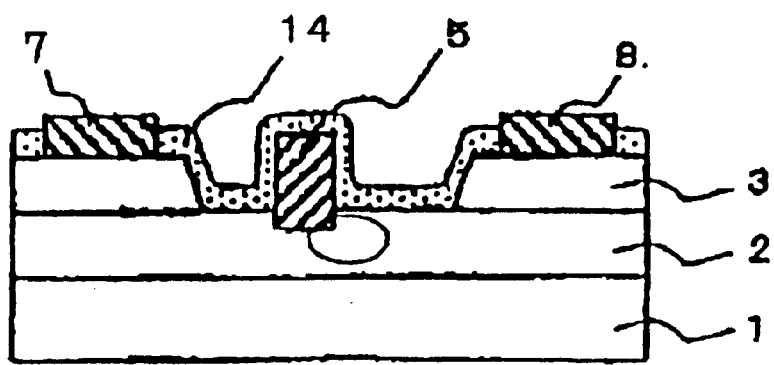
FIG. 14 is a schematic cross-sectional view of a conventional FET in explaining the field centralization on a lower end of a gate electrode therein.

The FET of the present example is provided with a float electrode 13 under a field plate section 9, as shown in FIG. 13. For this FET, after carrying out the steps of First example up to the step of FIG. 1(c) (the dielectric film 4 of FIG. 1 corresponds to a dielectric film 4a of FIG. 13) in the same manner, a metal material to constitute a float electrode 13 and then a dielectric film 4b are deposited. Next, the section where a gate electrode is to be formed is etched and thereafter a gate metal film 6 is formed over the entire surface. Subsequently, the same steps as those of First example after FIG. 2(e) are performed and the FET with a structure shown in FIG. 13 is accomplished. As a material for the float electrode, for instance, tungsten silicide (WSi), aluminium, gold, titanium/platinum/gold or the like can be utilized.

Because the FET of the present example is provided with a float electrode as described above, electrons are kept in the float electrode even when the applied voltage to the field plate section is switched off and, in consequence, the field centralization on the edge section of the gate electrode on the drain side is relaxed and spread over.

Tenth Example

In the FET of the present example, as shown in FIG. 16(g), a gate electrode is provided with an overhanging field plate section 9 and a dielectric film 4' made of $SiO_2$ is formed between this field plate section 9 and a channel layer 2.

Figure 15:
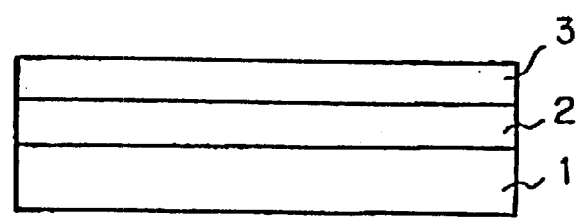
FIGS. 15(a)–15(d) are schematic cross-sectional views illustrating in sequence the steps of another manufacturing method of an FET in accordance with the present invention.
Figure 15:
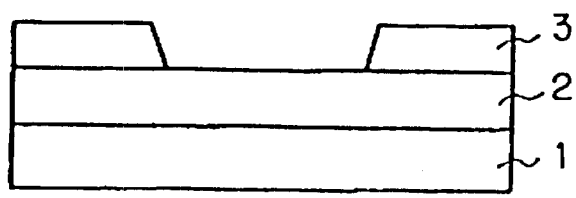
Figure 15:
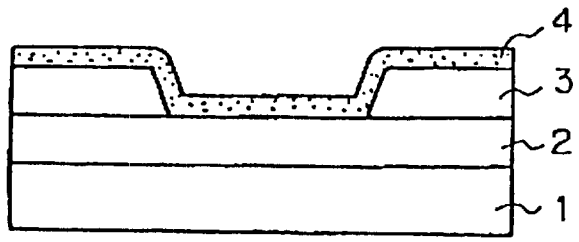
Figure 15:
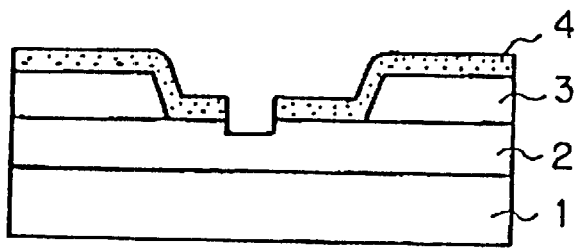
Figure 16:
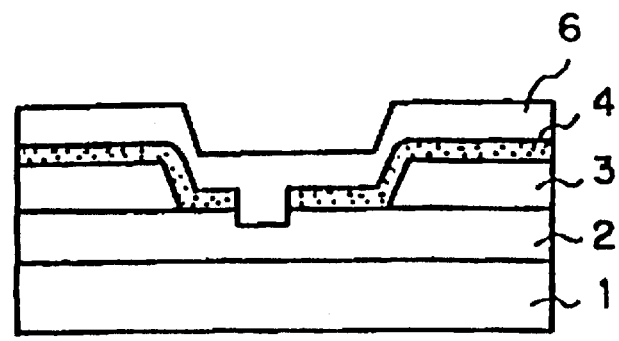
FIGS. 16(e)–16(g) are schematic cross-sectional views illustrating in sequence the further steps of the manufacturing method of the FET in accordance with the present invention.
Figure 16:
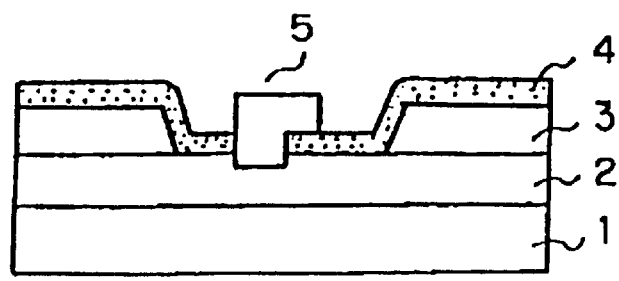
Figure 16:
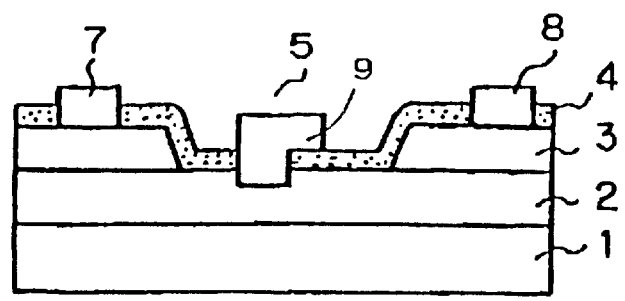

Referring to FIGS. 15 and 16, a manufacturing method of a FET of the present example is described below.

First, upon a semi-insulating GaAs substrate 1, an N-type GaAs channel layer 2 (with a thickness of 230 nm) doped with $2 \times 10^{17}$ $cm^{-3}$ Si and an N-type GaAs contact layer 3 (with a thickness of 150 nm) doped with $5 \times 10^{17}$ $cm^{-3}$ Si are grown in succession by the MBE (Molecular Beam Epitaxy) method (FIG. 15(a)).

Next, using a resist (not shown in the drawing) as a mask, the channel layer 2 and the contact layer 3 are etched by wet etching with a sulfuric acid based or phosphoric acid based etchant so as to form a recess (FIG. 15(b)).

A dielectric film 4' of $SiO_2$ is then deposited to a thickness of 150 nm over the entire surface by the CVD (Chemical Vapour Deposition) method (FIG. 15(c)). On this dielectric film 4', a resist (not shown in the drawing) is formed and, using this as a mask, a portion of the dielectric film 4' where a gate electrode is to be formed is etched by dry etching with $CHF_3$ or $SF_6$. Next, using the dielectric film 4' as a mask, a portion of the channel layer 2 where the gate electrode is to be formed is etched to a depth of 30 nm or so (FIG. 15(d)).

Next, a 100 nm-thick WSi film, a 50 nm-thick TiN film, a 15 nm-thick Pt film and a 400 nm-thick Au film are deposited, in this order, over the entire surface by sputtering, which forms a gate metal film 6 (FIG. 16(e)). After that, a photoresist is applied only to a section thereof where the gate electrode is to be formed, and the other superfluous section is removed by ion milling, and thereby a gate electrode 5 is formed (FIG. 16(f)).

Following this, the prescribed sections of the dielectric film 4' are etched to expose the contact layer 3 and then an 8 nm-thick Ni film, a 50 nm-thick AuGe film and a 250 nm-thick Au film are successively grown in this order by vacuum deposition and thereby a source electrode 7 and a drain electrode 8 are formed to accomplish an FET (FIG. 16(g)).

In the FET of the present example, $SiO_2$ is utilized as a material of the dielectric film 4' between the field plate section and the channel layer. The relative permittivity of $SiO_2$ is 3.9 or so and the film thickness of the dielectric film 4' is 150 nm. Thus, the value of $t/\in$ becomes approximately 38 and the following equations (1) and (2) are satisfied.

$$1 < \in < 5, \tag{1}$$

$$25 < t/\in < 70. \tag{2}$$

With a dielectric film 4' that satisfies the above conditions, the FET of the present example shows excellent characteristics of withstand voltage and, in addition, has a good protection against the breakdown of the dielectric film or the generation of the current leakage.

Eleventh Example

Apart from using a SiN film as a material of a dielectric film 4' and setting the film thickness thereof 200 nm, a FET is manufactured in the same way as Tenth example (FIG. 16(g)).

The relative permittivity of SiN is 7 or so and the film thickness of the dielectric film 4' is 200 nm so that the FET of the present example satisfies the following equations (1) and (2).

$$5 \leq \in < 8, \tag{1}$$

$$100 < t < 350. \tag{2}$$

Accordingly, the FET of the present example shows excellent characteristics of withstand voltage and, in addition, has a good protection against the breakdown of the dielectric film or the generation of the current leakage.

The entire disclosure of Japanese Patent Application No.HEI10-268394 including specification, claims, drawings and summary are incorporated herein by reference in its entirety.

What is claimed is:

1. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer by contact, said channel layer being uniform in thickness with the exception of the portion optionally etched-in where said gate electrode is in contact with said channel layer, said channel layer having a flat bottom surface in the region between the source electrode and the drain electrode, wherein said gate electrode is provided with an overhanging field plate section, and between said field plate section and said channel layer, there is laid a dielectric film, and when the relative permittivity and the film thickness of the dielectric film are denoted by $\in$ and t (nm), respectively, the following condition is satisfied:

$5 \leq \in < 8$, and $100 < t < 350$.

2. The field effect transistor according to claim 1, wherein said dielectric film is formed only in a region directly under said field plate section.

3. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, between said field plate section and said channel layer, there is laid a dielectric film, when the relative permittivity and the film thickness of the dielectric film are denoted by and $\in$ and t (nm), respectively, one of the following conditions (1) and (2) is satisfied:

$1 < \in < 5$, and $25 < t/\in < 70$, (1)

$5 \leq \in < 8$, and $100 < t < 350$, (2)

and the electrostatic capacitance per unit area of a capacitor that includes said field plate section and said channel layer separated by said dielectric film decreases with distance from the gate electrode.

4. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, between said field plate section and said channel layer, there is laid a dielectric film, when the relative permittivity and the film thickness of the dielectric film are denoted by and $\in$ and t (nm), respectively, one of the following conditions (1) and (2) is satisfied:

$$1<\in<5, \text{ and } 25<t/\in<70, \quad (1)$$

$$5\leq\in<8, \text{ and } 100<t<350, \quad (2)$$

and the thickness of said dielectric film directly under said field plate section is less on a side of said dielectric film closest to said gate electrode than a corresponding thickness of said dielectric film on a side of said dielectric film closest to said drain electrode.

5. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, between said field plate section and said channel layer, there is laid a dielectric film, when the relative permittivity and the film thickness of the dielectric film are denoted by and $\in$ and t (nm), respectively, one of the following conditions (1) and (2) is satisfied:

$$1<\in<5, \text{ and } 25<t/\in<70, \quad (1)$$

$$5\leq\in<8, \text{ and } 100<t<350, \quad (2)$$

wherein, said dielectric film is formed only in a region directly under said field plate section and one or more openings are formed in said field plate section.

6. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer by contact, said channel layer being uniform in thickness with the exception of the portion optionally etched-in where said gate electrode is to be in contact with said channel layer, said channel layer having a flat bottom surface in the region between the source electrode and the drain electrode, wherein said gate electrode is provided with an overhanging field plate section, between said field plate section and said channel layer, there is laid a dielectric film, when the relative permittivity and the film thickness of the dielectric film are denoted by and $\in$ and t (nm), respectively, one of the following conditions (1) and (2) is satisfied:

$$1<\in<5, \text{ and } 25<t/\in<70, \quad (1)$$

$$5\leq\in<8, \text{ and } 100<t<350, \quad (2)$$

wherein said dielectric film is formed only in a region directly under said field plate section and the edge section of said field plate section on the side of the drain electrode is comb-shaped.

7. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, between said field plate section and said channel layer, there is laid a dielectric film, when the relative permittivity and the film thickness of the dielectric film are denoted by and $\in$ and t (nm), respectively, one of the following conditions (1) and (2) is satisfied:

$$1<\in<5, \text{ and } 25<t/\in<70, \quad (1)$$

$$5\leq\in<8, \text{ and } 100<t<350, \quad (2)$$

and the permittivity of said dielectric film directly under said field plate section decreases with distance from said gate electrode.

8. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, between said field plate section and said channel layer, there is laid a dielectric film, when the relative permittivity and the film thickness of the dielectric film are denoted by and $\in$ and t (nm), respectively, one of the following conditions (1) and (2) is satisfied:

$$1<\in<5, \text{ and } 25<t/\in<70, \quad (1)$$

$$5\leq\in<8, \text{ and } 100<t<350, \quad (2)$$

and a float electrode is set under said field plate section.

9. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, between said field plate section and said channel layer, there is laid a dielectric film, when the relative permittivity and the film thickness of the dielectric film are denoted by and $\in$ and t (nm), respectively, one of the following conditions (1) and (2) is satisfied:

$$1<\in<5, \text{ and } 25<t/\in<70, \qquad (1)$$

$$5\leq\in<8, \text{ and } 100<t<350, \qquad (2)$$

wherein a field control electrode is set between said gate electrode and said drain electrode.

10. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, and between said field plate section and said channel layer, there is laid a dielectric film, and when the relative permittivity and the film thickness of the dielectric film are denoted by and $\in$ and t (nm), respectively, one of the following conditions (1) and (2) is satisfied:

$$1<\in<5, \text{ and } 25<t/\in<70, \qquad (1)$$

$$5\leq\in<8, \text{ and } 100<t<350, \qquad (2)$$

wherein a sub electrode is set between said gate electrode and said source electrode.

11. The field effect transistor according to claim 1, wherein said channel layer is made of a group III–V compound semiconductor.

12. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer by contact, said channel layer being uniform in thickness with the exception of the portion optionally etched-in where said gate electrode is to be in contact with said channel layer, said channel layer having a flat bottom surface in the region between the source electrode and the drain electrode, wherein said gate electrode is provided with an overhanging field plate section, and between said field plate section and said channel layer, there is laid a dielectric film having a non-uniform aspect.

13. The field effect transistor of claim 12, wherein said non-uniformity of said dielectric film is due to at least one of:

a variation in thickness of said dielectric film;

a variation in composition of materials forming various regions of said dielectric film;

a variation in composition such that said dielectric film comprises a plurality of layers having different composition;

a variation in composition of said dielectric film, wherein a floating electrode layer separates at least two layers forming said dielectric film;

a non-uniformity in an outline shape of an edge of said dielectric film closest to said drain electrode; and a predetermined set of openings in said dielectric film.

14. A field effect transistor, comprising:

a semiconductor substrate with a channel layer being formed on its surface;

a source electrode and a drain electrode being formed at a distance on said semiconductor substrate;

a gate electrode being placed between said source electrode and said drain electrode and making a Schottky junction with said channel layer, wherein said gate electrode is provided with an overhanging field plate section, and a dielectric film having a non-uniform aspect is formed between said field plate section and said channel layer; and at least one of:

a field control electrode located between said gate electrode and said drain electrode;

a sub electrode located between said gate electrode and said source electrode; and a floating electrode associated with said overhanging field plate section.

15. The field effect transistor of claim 12, wherein when the relative: permittivity and the film thickness of said dielectric film are denoted by and $\in$ and t (nm), respectively, one of the following conditions (1) and (2) is satisfied:

$$1<\in<5, \text{ and } 25<t/\in<70, \qquad (1)$$

$$5\leq\in<8, \text{ and } 100<t<350, \qquad (2).$$

16. The field effect transistor of claim 12, wherein said channel layer comprises a group III–V compound semiconductor.

17. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, between said field plate section and said channel layer, there is laid a dielectric film, when the relative permittivity and the film thickness of the dielectric film are denoted by and $\in$ and t (nm), respectively, one of the following two conditions (1) and (2) is satisfied:

$$1<\in<5, \text{ and } 25<t/\in<70, \qquad (1)$$

$$5\leq\in<8, \text{ and } 100<t<350, \qquad (2)$$

and, at least one of the following two conditions (3) and (4) is satisfied:

(3) a first distance between said gate electrode and said drain electrode is greater than a second distance between said gate electrode and said source electrode; and (4) a width of said field plate section is in the range 0.1 to 2.0 μm.

18. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer by contact, said channel layer being uniform in thickness with the exception of the portion optionally etched-in where said gate electrode is to be in contact with the channel layer, said channel layer having a flat bottom surface in the region between the source electrode and the drain electrode, wherein said gate electrode is provided with an overhanging field plate section, between said field plate section and said channel layer, there is laid a dielectric film having a plurality n of at least two layers, when the mean average relative permittivity and the film thickness of the dielectric film are denoted by and ∈ and t (nm), respectively, one of the following two conditions (1) and (2) is satisfied:

$$1<\in<5, \text{ and } 25<t/\in<70, \tag{1}$$

where $$t\in = t_1/\in_1 + t_2/\in_2 + \ldots + t_n/\in_n,$$

and $$5 \leq \in < 8, \text{ and } 100 < t < 350, \tag{2}$$

19. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, and said field plate section is configured such that the electrostatic capacitance per unit area of the capacitor formed by the field plate section and the channel layer decreases with increasing distance from the gate electrode.

20. A field effect transistor, comprising:

a semiconductor substrate with a channel layer being formed on its surface;

a source electrode and a drain electrode being formed at a distance on said semiconductor substrate; and a gate electrode being placed between said source electrode and said drain electrode and making a Schottky junction with said channel layer, wherein said gate electrode is provided with an overhanging field plate section, and at least one of the following two conditions (1) and (2) is satisfied:

(1) a first distance between said gate electrode and said drain electrode is greater than a second distance between said gate electrode and said source electrode; and (2) a width of said field plate section is in the range 0.1 to 2.0 μm.

21. A field effect transistor, comprising:

a semiconductor substrate with a channel layer being formed on its surface;

a contact layer being formed on said semiconductor substrate, said contact layer comprising two regions separated by a first distance;

a source electrode being formed on a first of said two regions of said contact layer;

a drain electrode being formed on the remaining of said two regions of said contact layer; and a gate electrode being placed between said source electrode and said drain electrode and making a Schottky junction with said channel layer by contact, said channel layer being uniform in thickness with the exception of the portion optionally etched-in where said gate electrode is to be in contact with the channel layer, said channel layer having a flat bottom surface in the region between the source electrode and the drain electrode, wherein said gate electrode is provided with an overhanging field plate section, wherein said gate electrode is separated from said first and second regions of said contact layer by at least a second distance, between said field plate section and said channel layer, there is laid a dielectric film, and when the relative permittivity and the film thickness of the dielectric film are denoted by ∈ and t (nm), respectively, one of the following conditions (1) and (2) is satisfied:

$$1<\in<5, \text{ and } 25<t/\in<70, \tag{1}$$

$$5 \leq \in < 8, \text{ and } 100 < t < 350, \tag{2}$$

* * * * *